(12) United States Patent
Dervin

(10) Patent No.: US 7,913,129 B2
(45) Date of Patent: Mar. 22, 2011

(54) METHOD OF TESTING DATA PATHS IN AN ELECTRONIC CIRCUIT

(75) Inventor: Patrick Dervin, Paris (FR)

(73) Assignee: Thales (FR)

( * ) Notice: Subject to any disclaimer, the term of this patent is extended or adjusted under 35 U.S.C. 154(b) by 336 days.

(21) Appl. No.: 12/173,278

(22) Filed: Jul. 15, 2008

(65) Prior Publication Data

US 2009/0027981 A1    Jan. 29, 2009

(30) Foreign Application Priority Data

Jul. 24, 2007  (FR) .................................... 07 05381

(51) Int. Cl.
*G11C 29/00* (2006.01)

(52) U.S. Cl. ....................................... 714/718

(58) Field of Classification Search ................... 714/718; 711/147, 148, 153, 156; 365/201
See application file for complete search history.

(56) References Cited

U.S. PATENT DOCUMENTS

| | | | | | |
|---|---|---|---|---|---|
| 4,298,958 A | * | 11/1981 | Takaki et al. | ................. | 717/127 |
| 4,825,360 A | * | 4/1989 | Knight, Jr. | .................... | 718/106 |
| 6,381,682 B2 | * | 4/2002 | Noel et al. | .................... | 711/153 |
| 6,665,777 B2 | * | 12/2003 | West | ............................. | 711/147 |
| 7,167,405 B1 | | 1/2007 | Wong et al. | | |
| 7,623,391 B1 | * | 11/2009 | Wong et al. | ............. | 365/189.07 |

FOREIGN PATENT DOCUMENTS

| | | |
|---|---|---|
| EP | 0919917 | 6/1999 |
| JP | 01251400 | 10/1989 |
| WO | WO 88/09554 | 12/1988 |

* cited by examiner

*Primary Examiner* — Phung M Chung
(74) *Attorney, Agent, or Firm* — Lowe Hauptman Ham & Berner, LLP (57) ABSTRACT

A method of testing an electronic circuit having a plurality of data transfer operators operating on memory resources defining a shared memory space is described. According to at least one embodiment, the shared memory space is initialized by writing data items to the shared memory space, and each data item is unique in the shared memory space. All or some of the shared memory space is partitioned into a plurality of disjoint memory blocks, the memory blocks being organized into one or more groups of blocks, each memory block belongs to one of the groups, and all memory blocks of the same group have the same size. A test scenario comprising at least one data transfer operation is executed, and the content of the shared memory space is verified.

16 Claims, 6 Drawing Sheets

METHOD OF TESTING DATA PATHS IN AN ELECTRONIC CIRCUIT

RELATED APPLICATIONS

The present application is based on, and claims priority from, French Application Number 07 05381, filed Jul. 24, 2007, the disclosure of which is hereby incorporated by reference herein in its entirety.

FIELD OF THE INVENTION

The present invention relates to a method of testing an electronic circuit, in which memory resources can be accessed in a concurrent manner by various data transfer operators.

BACKGROUND OF THE INVENTION

Electronic circuits are becoming increasingly complex, using powerful processors, and implementing refined data management and control mechanisms notably (parallelism, pipelines, etc.), allowing still higher calculation power. Their architectures are complex, with a plurality of buses: a local bus to which the processor or processors and their main memories are directly connected, and in certain cases with cache memory controllers; and one or more expansion buses which make it possible to add input and/or output functionalities, notably additional memory cards, graphical functionalities, serial links, local networks etc. The local bus is then connected to the controllers of the various expansion buses. Various bus standards are used, generally corresponding to specific functions. Among the well known standards may be cited, the PCI (parallel) or PCI Express (serial), and USB expansion buses, for which corresponding connectors are commonly provided on the mother boards of the electronic circuits, for connecting specialized cards or additional memory cards thereto.

These architectures thus comprise various memory resources accessible to the various operators through appropriate data interfaces. These memory resources thus form a shared memory space which typically groups together: memory areas on the local or host bus, and on the expansion buses, accessible through the interface or the corresponding controller. The memories of this shared memory space will be for example random-access memories of SDRAM type or of any other type (ZBT "Zero Bus Turnaround", DDR "Double Data Rate", QDR "Quadruple Data Rate", etc.) situated on the local bus or else made remote via a PCI bus, or programmable memories of flash EPROM type for example (USB bus), or other etc., and are read and/or write accessible.

As regards the various data transfer operators, they can be synchronous or asynchronous. They possess inherent work memory resources (registers, buffer memory), for temporarily storing the data exchanged, control information which defines the mode of operation of the interface (for example, direction of transfer: input/output, mode of transfer: interruption/polling), and state information, typically recorded in state registers, which advise notably as to whether transmission errors have occurred, and which are consulted by the processor. The operators can access the various common or shared memory areas of the electronic circuit. These operators can be software routines executed by the processor or services for transferring data blocks into memory or to communication networks, programmable automatons for transferring data blocks by Direct Memory Access (DMA), communication link controllers, such as serial or parallel link (UART) controllers, network controllers etc. the list does not presume to be exhaustive.

In these complex electronic circuits, accesses follow data paths comprising the various data interfaces, or controllers, through which the operators can read access and/or write access a given memory area. The various operators can act in a concurrent manner, requiring arbitrations on the access requests, which can be of various types. Notably the requests can be made according to a mode of transfer by polling or by interruption; and the structures of the data can vary according to the interfaces: byte (8 bits), word (16 bits), or other formats (24, 32 bits, etc.).

With the increasing complexity of these electronic circuits, the requirements as regards verifying the operation of these circuits have also grown, as has the difficulty of carrying out this verification in a satisfactory manner.

These verifications are notably very significant involving as they do circuits associated with security functions, such as onboard circuits embedded in aircraft: it is necessary to be able to certify their proper operation. Now, the asynchronous and concurrent processes which take place in these circuits give rise to many critical situations requiring arbitrations. It is necessary to be able to be certain that these situations and their arbitrations do not lead to any malfunction of the electronic circuit, in any circumstances. Stated otherwise, it is necessary to be able to verify correct operation in all possible situations.

According to a conventional approach, the test for verifying an electronic circuit ought to consist in reproducing all possible operating situations, and in verifying that for each of these situations, what is taking place is indeed what is expected for the situation considered. Such a test follows a systematic reasoned approach based on unit tests.

Such an approach encounters its limits in complex electronic circuits, on account of the multiplicity of situations to be envisaged and of the difficulty in envisaging them all, notably: multiplicity of resources, data paths, operators; concurrent behaviours of the various operators in accessing the memory resources, which involve arbitrations; pluralities of asynchronous clocks co-existing on the same circuit.

The latter feature is very penalizing in respect of the systematic reasoned approach based on unit testing since:
 the combinatorial complexity resulting from the phase relations between the asynchronous clocks is tied to a continuous and no longer discrete physical phenomenon, thereby involving an uncountable quantity of different situations,
 the respective phase of the asynchronous clocks is generally not controllable.

At the same time, verification of the proper operation of the electronic circuits defined for carrying out critical functions is further complicated by the use of so-called COTS components, as opposed to components designed specifically for the application, that are necessarily more expensive. The use of COTS components makes it possible to meet the pressing demand from the market to reduce costs. On the other hand, it requires that the verifications performed be particularly effective in testing the behaviour of these components in critical situations, to alleviate the lack of complete design data on these COTS components.

Finally, recourse to external test toolkits to verify the data sent over the external communication links (serial links, networks, etc.) is a complex solution to implement notably in respect of the synchronization aspects.

SUMMARY OF THE INVENTION

An object of the invention is thus to propose an innovative expedient for verifying data paths that is easy to implement and which makes it possible to certify with a high level of confidence the absence of conceptual defects in an electronic circuit, more particularly in complex electronic circuits.

In the invention, it is shown that verification of the proper functional operation of an electronic circuit can be ensured by verifying that the data exchanges take place properly in any situation.

In the invention, verification that the data exchanges take place properly in any situation relies on using invariants associated with the shared memory space: size of data blocks and initial content of data blocks, and on operations for transferring these data blocks on the data transfer operators, defined in a random or pseudo-random manner, which make it possible to verify easily and throughout the domain of application, or of use, of the operators, that the data exchanges by these operators on the shared memory resources are done correctly.

The invention therefore relates to a method of testing an electronic circuit comprising a plurality of data transfer operators operating on memory resources defining a shared memory space, characterized in that it comprises:

a phase of initializing the said memory space, in which each address of the shared memory space is initialized with a data item which is unique in the said memory space, a phase of defining a test scenario comprising a partitioning of all or some of the said memory space into a plurality of disjoint memory blocks, organized into groups of blocks, at least one group, such that a block belongs to a single group; and the blocks of a group all have the same size;

and at least one phase of executing a test scenario comprising at least one data transfer operation, each data transfer being a transfer defined on a given transfer operator and on a given group of blocks, for writing the content of a source block, to a destination block of the same group;

a phase for verifying the content of the shared memory space.

With a test scenario executed according to the test method of the invention, the patterns move within a group, from block to block. If the execution of the transfers requested takes place correctly, the patterns will be moved without distortion in the group, and the memory content in the other areas of the memory space that are not involved in these transfers will not be affected. The verification phase thus verifies the content of the shared memory space in the memory areas on which transfer operations are executed and in the other memory areas, that are normally not involved.

Advantageously, each initialization data item is a bijective function of this address, so that after initialization the memory content at each address not affected by data transfers is easily known or determinable on the basis of the address.

Advantageously, the partitioning phase furthermore comprises an indexation of the blocks by an initial index identifying in a bijective manner, a unique pattern equal to the set of data for initialization of the corresponding block, and an initialization of a movement table for each group, the said table comprising for each block, a current index initialized with the said initial index.

The association of an initial index with each block in a group, which index is a bijective function of the initial pattern of this block, facilitates the verification of the content of each block of the group in conjunction with the associated movement table: each new transfer performed on the group is registered therein, by writing the current index of the source block, as current index of the destination block, so that for each block, its physical content after carrying out a series of transfer operations is known or determinable, on the basis of the corresponding current index.

According to an aspect of the invention, the movement table of a group has a finite size whatever the number of transfers performed in the block: the current state (current index) of each of the blocks of the group is stored, with no memory of the previous transfers executed.

Each transfer operation is defined in a random or quasi-random manner, by a random or quasi-random choice of one at least of the following parameters: a transfer operator, a mode of transfer, a group, a source block on this group, a destination block on this group.

These choices can be constrained by a domain of use associated with each operator.

Still other objects and advantages of the present invention will become readily apparent to those skilled in the art from the following detailed description, wherein the preferred embodiments of the invention are shown and described, simply by way of illustration of the best mode contemplated of carrying out the invention. As will be realized, the invention is capable of other and different embodiments, and its several details are capable of modifications in various obvious aspects, all without departing from the invention.

Accordingly, the drawings and description thereof are to be regarded as illustrative in nature, and not as restrictive.

BRIEF DESCRIPTION OF THE DRAWINGS

The present invention is illustrated by way of example, and not by limitation, in the figures of the accompanying drawings, wherein elements having the same reference numeral designations represent like elements throughout and wherein.

DETAILED DESCRIPTION OF THE INVENTION

The invention is described in conjunction with an embodiment applied to an exemplary architecture of an electronic circuit comprising a shared memory space, accessible to various data transfer operators provided in the circuit.

The invention does not relate per se to an electronic circuit architecture. These architectures can be extremely varied according to the applications concerned, and the processors and buses used. The invention relates to an exhaustive method of verifying data paths in an electronic circuit architecture. Numerous variants of bus architecture and of operators exist, as a function of the applications, which cannot all be enumerated here, etc. but to which the invention may be applied.

Figure 1:
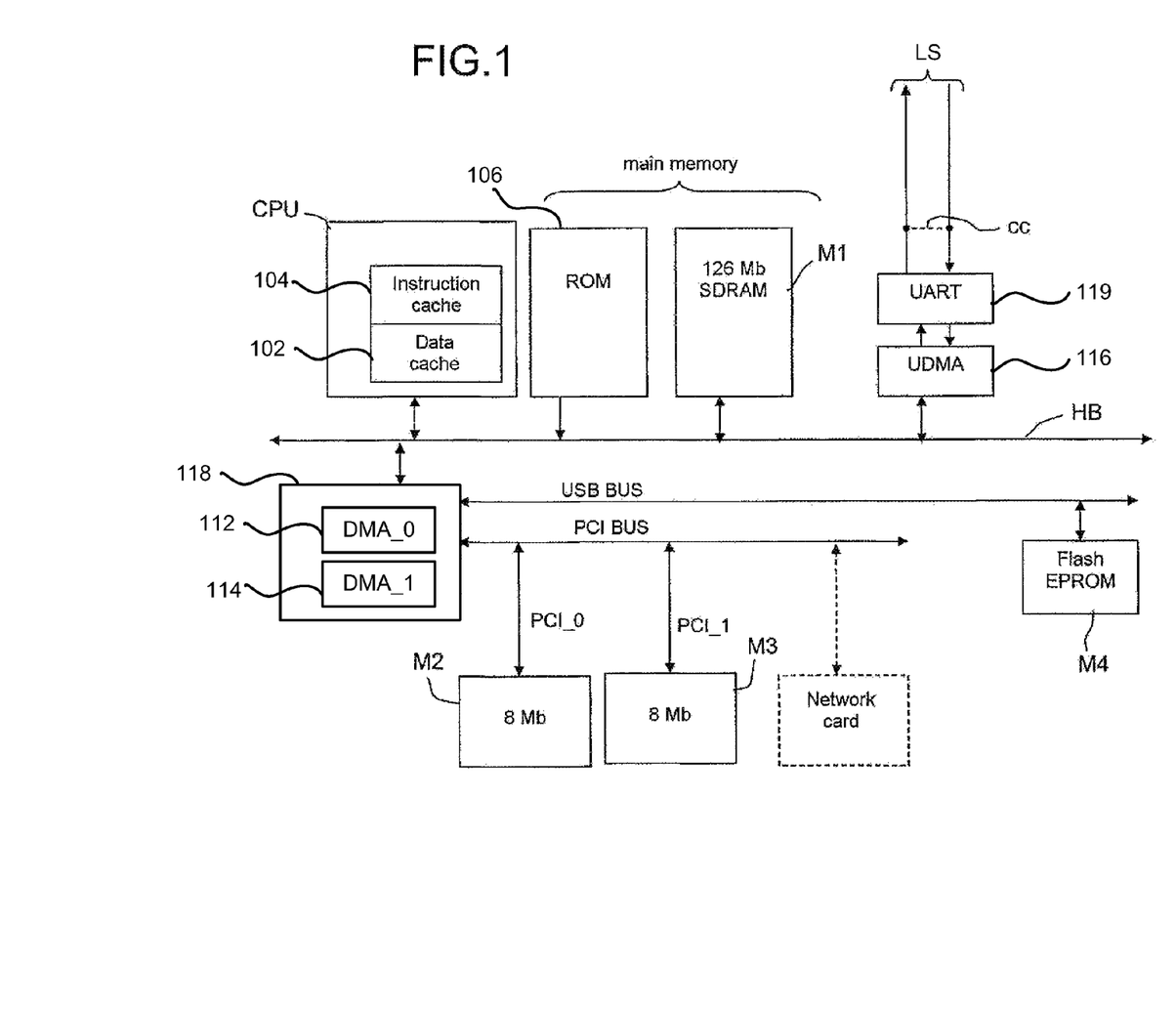
FIG. 1 schematically illustrates an exemplary electronic circuit with transfer operators operating on a shared memory space.

FIG. 1 illustrates by way of example, a prior art computer architecture with a shared memory space 1 to which the test method of the invention may advantageously be applied.

The architecture is organized around an internal or host bus HB, and various expansion buses, according to well known standards. In the example: a first expansion bus EB, for example a bus of USB type (Universal Serial Bus), to which is connected a memory M2 of flash EPROM type, read/write accessible, 8 Megabytes in the example; and a first and a second expansion bus of PCI type (Peripheral Component Interconnect), denoted PCI_0 and PCI_1. To each of these expansion buses PCI_0, respectively PCI_1, is connected an expansion memory card, M3, respectively M4, each 8 Megabytes in the example.

On the internal bus HB is a central unit card CPU, in the example a central unit with separate data cache memory 102 and instruction cache memory 104 (level 1 cache); an associated ROM program memory card; a random-access memory card M1 of SDRAM type (Synchronous Dynamic Ram), 126 Megabytes in the example, and transfer operators 112, 114, and 116, other than the processor CPU. In the example, two direct access controllers DMA_0 112 and DMA_1 114 have thus been grouped together in a bridge 118 making it possible to sequence notably transfers between the memories situated on either side of the bridge 118, a UDMA direct memory access controller 116 of which a port is connected at input to a USART (Universal Synchronous Transmitter) controller 119 of a serial link LS, and another port is connected to the output of this controller 119.

Figure 2:
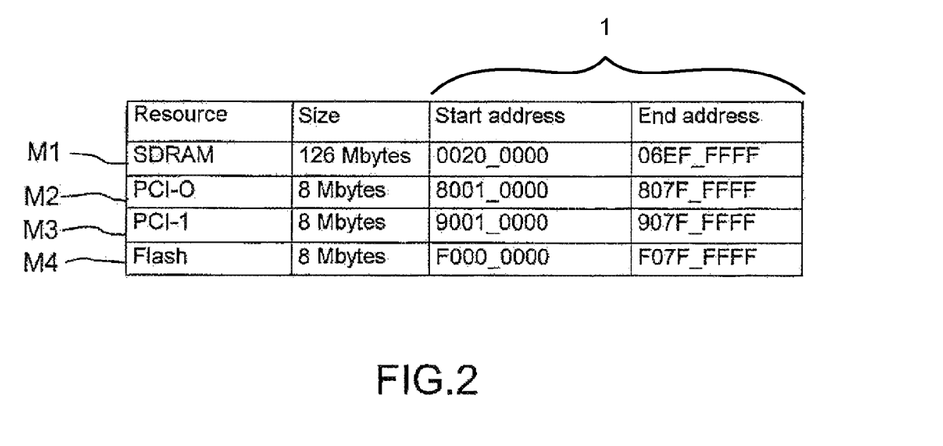
FIG. 2 illustrates the various memory resources of this shared memory space.

As illustrated in the form of an array in FIG. 2, the shared memory space 1 is formed of memory areas of the memory cards M1 to M4, each defined by their start and end addresses. In practice the whole of the memory space of each card is not a shared resource. Specifically, in each memory card, a small memory area, typically 4 Kbytes, is reserved for the local processor of the memory card. In the example, the area [0020_0000-06EF_FFFF] of the memory M1 is read/write accessible as a shared resource; the area [8001_0000-807F_FFFF] of the memory M2 and the area [9001_0000-907F_FFFF] of the memory M3 each are read/write accessible as a shared resource on their respective expansion bus, PCI_0 for M2 and PCI_1 for M3; the area [9001_0000-907F_FFFF] of the memory M4 is read/write accessible as a shared resource on the expansion bus EB.

In the architecture illustrated, we thus have:
  four data interfaces, namely the read/write SDRAM memory, and the three expansion buses: the read expansion bus of the flash memory M4, and the two read/write expansion buses PCI_0 and PCI_1 respectively of the memory M2 and of the memory M3; and
  three hardware transfer operators: the direct memory access operators DMA_0, DMA_1, UDMA, and
  an unbounded set of software transfer operators implemented as sequentially run routines executed by the processor of the CPU.

The test method of the invention comprises a phase of initializing the shared memory space by data, each data item written at a position of the memory space being unique in the memory space. Advantageously, this data item is defined by a bijective function of the address of this memory position.

Then a phase of partitioning the shared memory space is activated, in which blocks of various sizes are defined in this space, blocks that are distributed into groups, at least one group, with the following rules: a group comprises only blocks of identical size; and a block belongs to a single group.

A phase of defining and executing a scenario is carried out, so as to execute at least one data transfer operation on the shared memory space, each transfer being defined on a group and an operator, so as to have this operator read the content of a block of this group and write it to a block of the same group.

The partitioning of the blocks is parametrizable. It is defined for at least one scenario.

To allow movements of the patterns without distortion, independently of one another, the partitioning is carried out in such a way that the blocks are all disjoint: there is no overlapping of blocks.

According to the partitioning carried out, the blocks defined in a slicing phase may not cover the whole of the shared memory space.

Figure 3:
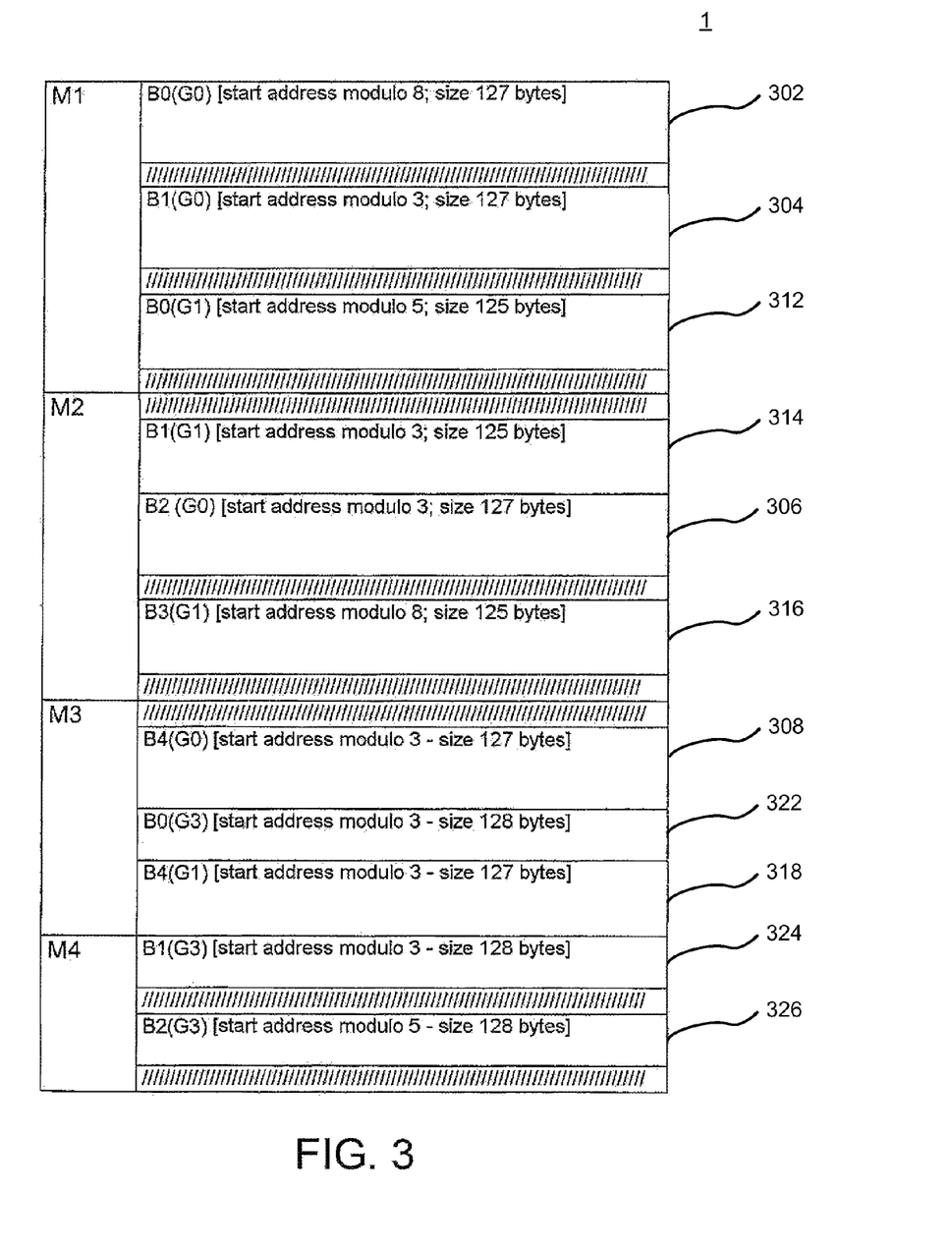
FIG. 3 illustrates an exemplary partitioning of such a memory space according to the invention.

The slicing is carried out to allow the testing of the various functionalities of the operators. Notably, as illustrated in FIG. 3:
  a group will be able to contain blocks of the same size but of different alignments: for example some blocks will have a start address modulo 8, other blocks will be able to have a start address modulo 3. This makes it possible to test the capacity of one or more operators to carry out transfers of blocks of varied alignment;
  the size associated with a group is chosen so as to make it possible to test transfers of data blocks around the limit sizes. For example, if an operator's transfer parameter is a maximum block size of 256 bytes, it is possible to envisage a group where the size of the blocks is 255 bytes, another where it will be 256, another where it will be 257. This makes it possible to test the limit situations of the domain of use of this operator.

In a test method according to the invention, it has been seen that the shared memory space is initialized with a unique data item per memory position. Thus, each block is initialized with a unique content or pattern equal to the set of initialization data contained in this block.

For example, as depicted in FIG. 3, the shared memory space 1 comprises a first group G0, a second group G1, and a third group G3. The first Group G0 has a first block 302 and a second block 304 at the memory M1, a third block 306 at memory M2, and a fourth block 308 at memory M3. The second Group G1 has a first block 312 at the memory M1, a second block 314 and a third block 316 at memory M2, and a fourth block 318 at memory M3. The third Group G3 has a first block 322 at the memory M3, and a second block 324 and a third block 326 at memory M4.

Each transfer operates on a single group, to copy the content of a block into another block of the same group. The blocks being disjoint, they are really the elementary objects transferred. The content of each block being unique, in the case where transfers are implemented with conservation of the order of the bytes, and when the electronic circuit is operating correctly, the pattern inside the blocks moves, without distorting, in the course of the transfers. With each transfer performed, a corresponding information cue can be registered in a movement table so that after a series of transfers, the pattern which ought to be contained in each block of the group is known or determinable, and can be compared with the pattern actually found in each of the blocks. If there is any difference, then operation is not correct.

According to an advantageous implementation of the invention, there is provision:
  to associate an initial index with each of the blocks of a group, making it possible to identify this unique pattern in a bijective manner. This initial index is unique: unique in the shared space 1 or unique in its group, each group being identified in a unique manner in the shared space.
  to associate a movement table with each group, containing for each block a current index. At the outset, the current indices are the initial indices of the blocks. Thereafter, each transfer of a block of a group to a block of this group causes a writing of the index of the source block as current index of the destination block. This allows a phase of effective verification of the contents of the blocks of the various groups, by reading for each block the current index, which uniquely identifies the pattern that ought to contain the block at this moment.

In illustration of this, consider a group G0 of five blocks B0 to B4. The blocks are indexed: to each block there corresponds an index n of the block n=0 to 4 in the example. Each block Bn contains after initialization of the shared memory space, a unique pattern pn: p0 to p4, for B0 to B4 in the example. The patterns are the physical content of the blocks: that is to say the pattern of a block comprises all the values of all the bytes or words or double words (according to the memory structure) of this block. After initialization, the pattern of each block is thus a bijective function of the index of the block that it initializes. The index 0 uniquely identifies the pattern p0 for example, more generally the index n uniquely identifies the pattern pn.

According to the invention, it is thus possible to identify the physical content pn of the blocks by its logical content n. In a movement table, each transfer of a source block, into a destination block, can be registered in a simple manner, by the corresponding transfer function, by writing to the table the new logical content of the arrival block, that is to say the index of the source block. This logical content defines in a definite manner the physical content that the destination block ought to have on completion of this transfer. Following a series of transfers, the last logical content of each block makes it possible to identify in a definite manner the physical content that it ought to have.

Figure 4:
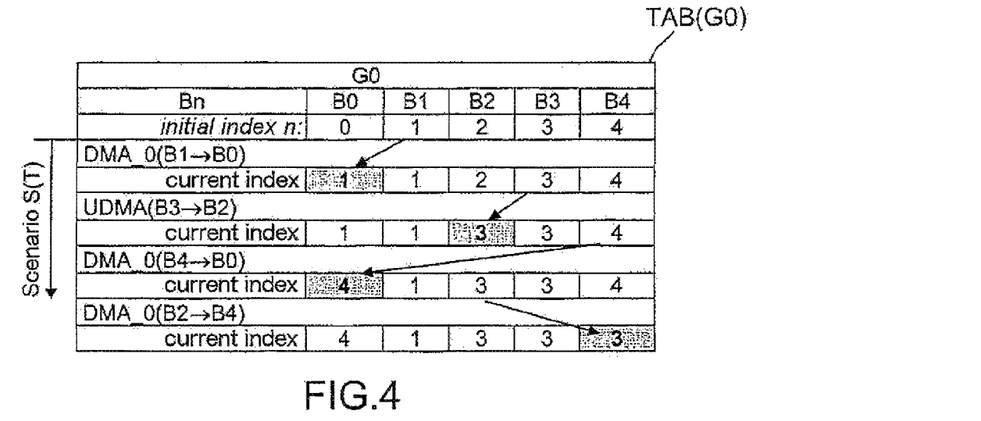
FIG. 4 illustrates an associated movement table.

Let us illustrate this by a practical example, in conjunction with FIG. 4: Take a group G0 which comprises five blocks B0 to B4 of respective index 0 to 4. Each index 0, 1, 2, 3, 4 uniquely identifies (bijective relation) a corresponding pattern p0, p1, p2, p3, p4. Assume that the test scenario S(T) comprises the series of following transfer operations, on the group G0:

transfer of the content of block B1 to B0 by the operator DMA_0;
transfer of the content of block B3 to B2 by the operator UDMA;
transfer of the content of block B4 to B0 by the operator DMA_0;
transfer of the content of block B2 to B4 by the operator DMA_0.

It is noted at this point that the transfers of a series can according to case, be carried out simultaneously or in sequence.

In accordance with the principles stated above, a corresponding movement table TAB(G0) is constructed, illustrated in FIG. 4, which is updated by each of the operators responsible for the transfers performed. After the last transfer, it is possible to read in the movement table, that:

the logical content of B0 is the index 4;
the logical content of B1 is the index 1;
the logical content of B2 is the index 3;
the logical content of B3 is the index 3;
the logical content of B4 is the index 3.

As may be seen in FIG. 4, at each juncture, the current state of the movement table comprises two identical indices for two different blocks, the source block and the destination block, corresponding to the index of the source block of the transfer performed.

Thus, a verification phase following these three transfers will have to verify that the physical contents of the blocks correspond to the logical contents indicated in the movement table, that is to say here that the physical content of B0 is indeed the pattern p4; that of B1, p1; that of B2, p3; that of B3, p3; and that of B4, p3.

In this example, it may be observed that the patterns p0 and p2 have irretrievably disappeared from the group. In practice, it is useful to establish rules of transfer to a group, by which the depletion of the patterns is limited.

This can be advantageously obtained by implementing a brainteaser game type mechanism on each group, by which mechanism a single pattern is sacrificed which is that of the block which will be the destination block of the first transfer performed, the movements having to satisfy the following rule: the source block of each transfer becomes the destination block of the following transfer. By this mechanism, the space of possibilities of transfers is constrained, but on the other hand a very large number of block transfers can be carried out on a group of finite size. The depletion of the patterns of the group is limited to the pattern of a single block.

This mechanism assumes that a transfer is executed only once the previous transfer has been carried out. This can be checked by means of a simple mechanism which consists in adding a reserved or unreserved state indicator for a block, as will be detailed further on.

Figure 5:
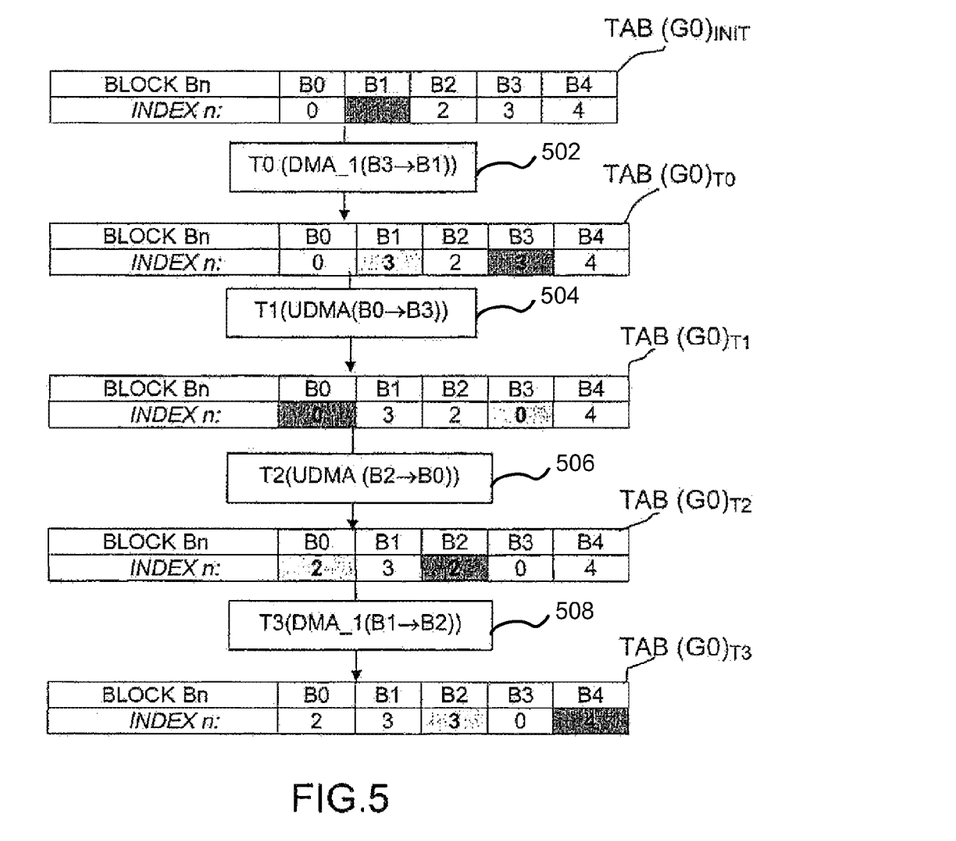
FIG. 5 illustrates a test scenario for this electronic circuit based on a mechanism for moving blocks, used in the invention.

An illustration of this mechanism for defining the transfers is given in FIG. 5, which gives the state of a movement table associated with the group G0 comprising five blocks B0, B1, B2, B3, B4, each indexed by a corresponding index equal to 0, 1, 2, 3 and 4 respectively.

In the example which is illustrated, the destination block of the first transfer 502 executed is B1: the initial content p1 of this block will be sacrificed. All the transfers 502, 504, 506, and 508 are governed by the aforesaid rule.

T0(B3→B1) T1(B0→B3) T2(B2→B0) T3(B1→B2)

At the end the current state of the indices for blocks B0, B1, B2, B3 and B4 are respectively 2, 3, 3, 0, 4.

As may be seen, a single pattern is sacrificed: the pattern p1 of the destination block B1 of the first transfer. The transfers having the particular feature that their destination block is the source block of the previous transfer, the "sacrificed" block (dark grey in FIG. 5) moves in the inverse direction of the transfers performed.

As illustrated in FIGS. 4 and 5, the content of the memory can be verified easily after any sequence of transfers according to a test method following the invention, by virtue of the continuous tracking of the movements of the patterns by the movement table associated with the group: it suffices to verify that the physical content of a block is indeed consistent with the logical content indicated in the table of movements. Thus, the phase of verifying the content of the blocks needs only the movement table, which is updated automatically by the transfer functions of the operators, as and when they are effected, and the bijective relation between each index and the associated pattern. This relation may be accessible for example through a table giving for each block, the initial index. The start and end addresses of each block can be read from a partitioning table. As the initialization data item is unique for each address, and advantageously a bijective function of this address, it is possible to ascertain or determine this data item at each position of the block.

This verification phase is therefore advantageously simple to implement. Its writing does not depend per se on the transfers which are performed or on the operators which effect these transfers. It is written once and for all and is operational to verify any sequence of transfers whatsoever. In particular, it remains valid even for randomly defined transfer sequences (while taking care with the concurrent operation of the transfer operators).

In practice, the test algorithm with its various partitioning, initial indices, movement and other tables required by the test method are executed in work memory of the processor: SDRAM or advantageously in cache memory.

Figure 6:
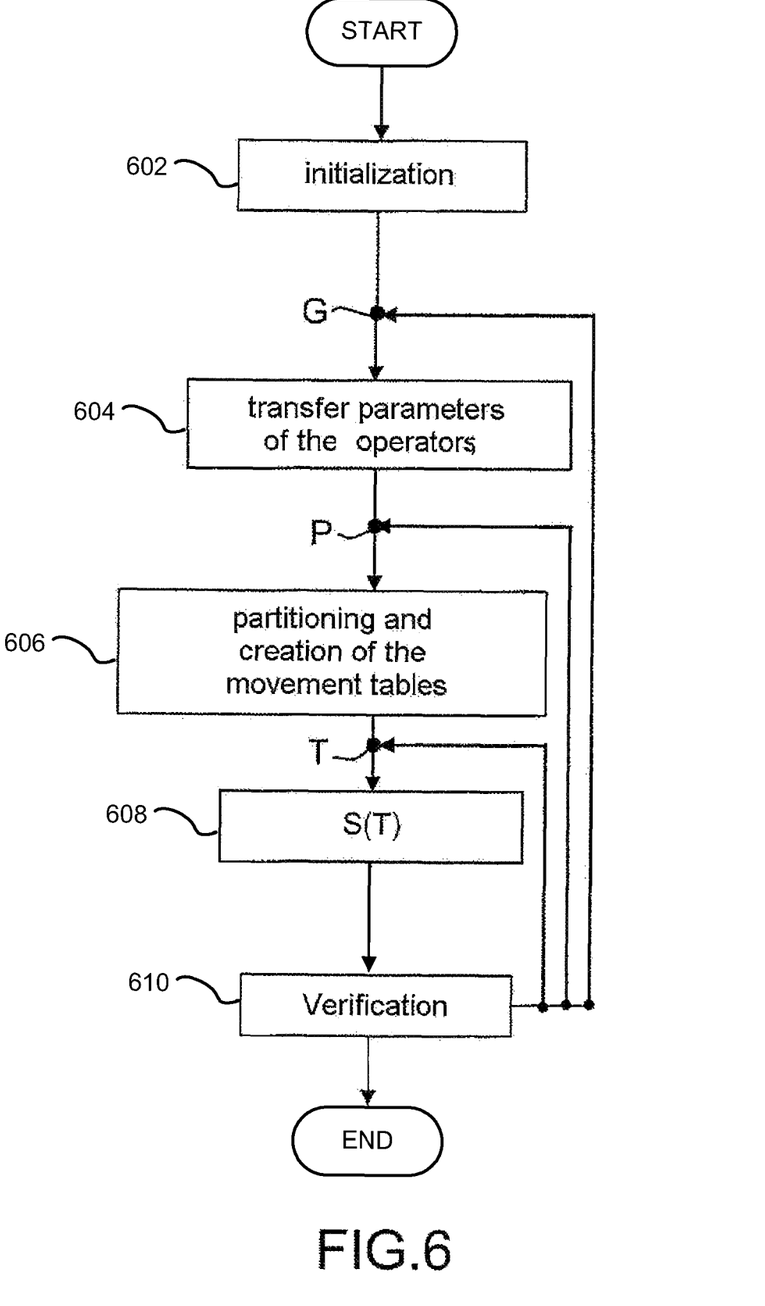
FIG. 6 is a general flowchart of a test method according to the invention.

More generally, a method according to the invention can comprise several phases in sequence, with loopback possibilities at certain points of the sequence, as illustrated schematically in the flowchart of FIG. 6.

This flowchart indicates key phases of the test method which are the following:
Phase 602 of initializing the shared memory space 1 with data such that at each address of the memory space, the data item is a bijective function of this address;
Phase 606 of partitioning the memory space, to define the groups, the blocks of the groups, and initialize the movement table of each group.
Phase 608 of defining and executing a transfer scenario
Phase 610 of verifying that the content of the memory space corresponds to the scenario executed.
This verification phase 610 mainly comprises:
the reading of the various state registers of the transfer operators invoked by the test, to verify the absence of error signalling;
the verification that in the memory areas of the memory space outside of the groups of blocks on which the scenario is executing, the data have not changed;
the verification of the physical contents of the blocks in the groups. This verification advantageously uses the movement tables previously described.

This flowchart also indicates a phase 604 of initializing the transfer operators, prior to the partitioning phase 606, for initializing the transfer parameters of the operators such as notably: mode of transfer, size of the grains (blocks) of the transfer, error detection, the activation or otherwise of an error correction mechanism, the creation or otherwise of errors correctible by the said mechanism, response times of electronic components ("latency timer" parameter of the PCI component, and "CAS latency" parameter of an SDRAM, etc.).

The importance of this phase of the test is in covering the domain of use of the operators. Specifically the random or quasi-random choices made in the phase of partitioning the shared memory space and of defining the transfer operations of the scenario or scenarios, can be constrained so as to best cover the domain of use of the operators, which is in part defined by the transfer parameters of these operators.

The method thus advantageously allows the execution of three test loops whose inputs in the flowchart are denoted "T", "P" and "G", making it possible to test the whole set of domains of use of the various transfer operators on the whole of the shared memory space.

The first loop "T", the innermost, makes it possible to execute several series of transfer operations, with a verification step 610 between two series. These can be predefined, or random or quasi-random operations. The random aspect can relate to: the group and/or the blocks on which the transfer is performed, and/or the operator that must carry out the transfer.

The middle loop "P" makes it possible to modify parameters of the scenario ensuing from the partitioning of the shared memory space, definition of the number of groups, of their sizes; definition of the blocks: number of blocks per group, alignments of the blocks in each group, before rerunning one or more scenarios of one or more transfer operations.

The outermost loop "G" makes it possible to change operating parameters of the operators: maximum size of the blocks per operation, mode of transfer (interruption or polling), error correction etc.

It will be noted that the term "loop" should be taken within the broad sense within the context of the invention, signifying any backpedalling in the steps of the flowchart. The repetition of a loop is not necessarily a repetition of one and the same sequence of operations ("for" loops, which may be written "for n=1 to N, execute the operations which follow"), but more generally of one and the same type of operations. Two passes through the same loop may thus be identical (for loop) or different, according to the writing of the scenario. Notably, in the case of random type transfers, two passes through a loop will be written in sequence, for example as follows:
For i=1 to k,
(T) random transfer
  random transfer
(V) Verification
(R) return to (T)

All the loops terminate with a verification step, each loop corresponding to a test scenario.

It will be noted that a verification phase associated with a scenario can be started only after the end of all the transfers of this scenario.

The definition of the test must in practice take account of the domains of use of the various operators. For example, the block sizes are defined in one or more partitionings (repetition of loop "P") to cover the various modes of transfer of the operators. If an operator is defined for transferring data in blocks of 128 bits, blocks and their group(s) will be defined with this size, and slightly smaller sizes (126 bits for example) or slightly larger sizes (129 bits for example), to test the operators at the limit of their domains of use. Likewise, within a group, different address alignments are advantageously provided, which make it possible to test the operators in all the ensuing situations.

Additionally, certain operators being concurrent, for example the direct memory access programmable automatons (DMA_0 and DMA_1) and the processor CPU in the example of FIG. 1, the writing or the management of the execution of a scenario must make it possible:
to prevent several transfer operators from accessing the same block of data at the same time.
to verify that the execution of a transfer by an operator starts only after a first transfer has terminated, when for example the source block of the second transfer is the destination or result block of the first transfer, as in the mechanism previously described in conjunction with FIG. 5.

This can be done by providing a table for tracking the use of the blocks, comprising an information cue R, associated with each block, flagging the state as reserved or unreserved. This logic information cue R can thus be in the 0 state, or in the 1 state, signifying respectively, in an exemplary convention, free or occupied state. Such a tracking table TAB_R is illustrated as an example in FIG. 7. This table is consulted by the transfer operators before performing a transfer.

Figure 7:
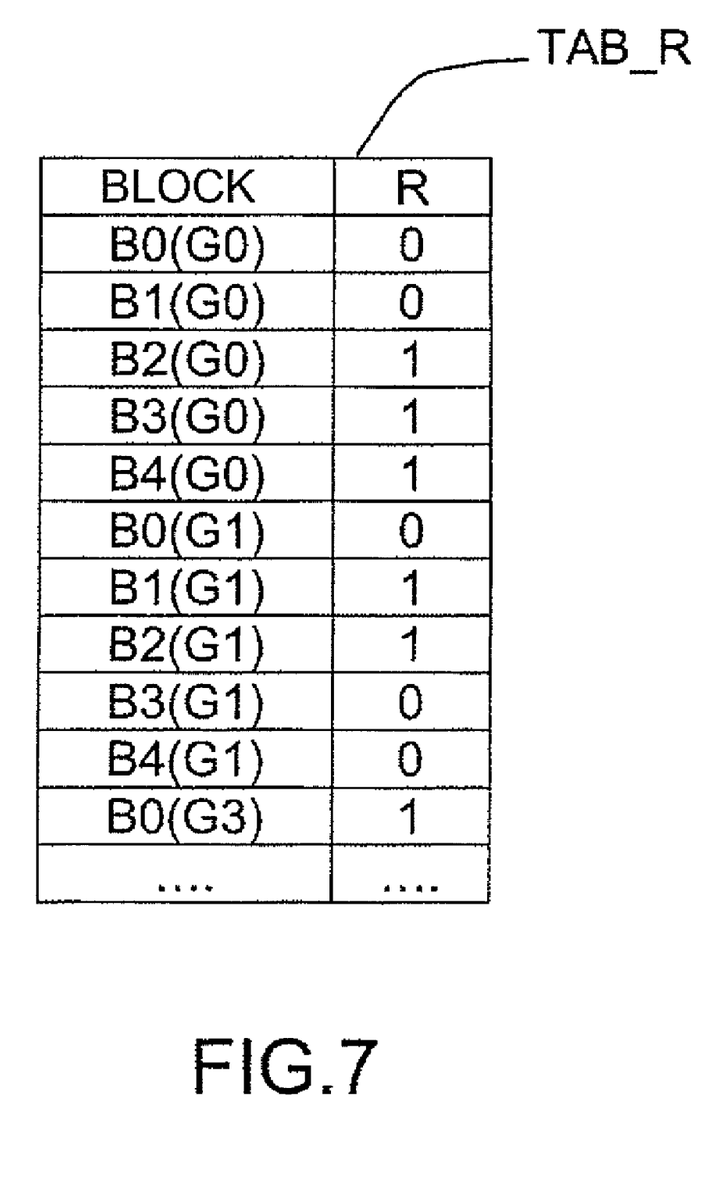
FIG. 7 illustrates a table for tracking the use of the blocks.

This tracking table can also advantageously be used with polling to activate the verification phase subsequent to a scenario S(T), so that it starts only when all the blocks are in the unreserved state.

A transfer can start only if at least the destination block is in the unreserved state, not necessarily the source block (it is generally possible to make several read-accesses simultaneously).

In the case where the transfer depends on the execution of a previous transfer as indicated above, it will be necessary for the source block and the destination block involved in a transfer operation to both be in the unreserved state (R=0). This will for example be the case if the scenario implements a scenario of transfers defined according to the brainteaser game type mechanism previously described in conjunction with FIG. 5.

As regards the transfer operators themselves, in addition to the precautions to be taken for the concurrent operations to be carried out, other precautions may be taken in practice. Notably, being as it is an LS serial link UART controller associated with a UDMA direct memory transfer automaton (FIG. 1), it would be too complex to implement an external toolkit to verify data sent by the UART controller or to dispatch data to this controller, mainly because of the synchronization problems.

In practice provision is made to use this automaton with the UART controller, looped back on itself, the input of the serial link of the controller being looped back to the output of this link (link cc in FIG. 1). The UDMA automaton is then initialized to operate at one and the same time in transmission on a port associated with the transmission line of the serial link and in reception on another port associated with the reception line of the serial link, with the same length: Used thus, the UDMA is equivalent to an SDRAM/SDRAM DMA.

The effect of this mode of use of the serial link controller is a small restriction in coverage of the domain of use of the controller.

Nevertheless, the transmission operates only for a short instant at the start, before the automaton receive its first data via the input of the serial link. Likewise, at the end, sending operates only while the controller in transmission mode empties its buffer memory after the automaton has terminated its operation.

Finally, a step of verifying the absence of bias in the statistical distribution of the events accumulated in histograms during the execution of the test method will advantageously be provided. For this purpose provision is made for the creation of histograms of events corresponding to the transfer operations (transfers performed and associated transfer parameters) carried out during the execution of the test.

For this operation the significant characteristics of the operators, whose histograms will be plotted, typically by noting the list of the operators, the selections of the parameters performed, and by sampling the current state of the operators, will in practice be identified.

Statistical markers are thus obtained, whose behaviour can be verified to be as expected, making it possible to verify that the various random selections have made it possible to traverse the domain which should be traversed, without bias. Notably, it is possible to detect poor parallelism of operators.

A test method according to the invention makes it possible by verifying the data paths of the electronic circuit over substantially all the domains of use of the operators and under limit conditions, to certify the proper functional operation of a complex electronic circuit.

It will be readily seen by one of ordinary skill in the art that the present invention fulfills all of the objects set forth above. After reading the foregoing specification, one of ordinary skill in the art will be able to affect various changes, substitutions of equivalents and various aspects of the invention as broadly disclosed herein. It is therefore intended that the protection granted hereon be limited only by the definition contained in the appended claims and equivalent thereof.

The invention claimed is:

1. A method of testing an electronic circuit comprising a plurality of data transfer operators operating on memory resources defining a shared memory space, comprising:
   initializing the shared memory space, including writing data items to the shared memory space, each data item being unique in the shared memory space;
   partitioning all or some of the shared memory space into a plurality of disjoint memory blocks, the memory blocks being organized into one or more groups of blocks, each memory block belonging to one of the groups, and all memory blocks of the same group having the same size;
   executing a test scenario comprising at least one data transfer operation, each data transfer being a transfer defined on a given one of the data transfer operators and on a given group of blocks, for writing the content of a source block, to a destination block of the same group; and
   verifying the content of the shared memory space.

2. The test method according to claim 1, wherein during the initialization, each data item is defined by a bijective function of an address of a corresponding position to where the data item is written.

3. The test method according to claim 1, wherein the partitioning comprises:
   performing an indexation of the blocks by an initial index that is arranged for identifying, in a bijective manner, a unique pattern equal to one of the data items written in a corresponding one of the memory blocks during performance of the initialization; and
   initializing a movement table associated with each block, comprising for each block, a current index initialized with the said initial index, and
   wherein during the execution of the test scenario, each data item transfer gives rise to a writing of the current index of the said source block as current index of the said destination block to a movement table associated with the said group.

4. The test method according to claim 3, wherein the movement table associated with each block has a finite size.

5. The test method according to claim 1, further comprising initializing the data transfer operators, prior to said partitioning, for initializing transfer parameters of each operator.

6. The test method according to claim 1, wherein the verification comprises verifying the contents of the blocks of each group corresponds to the data transfer operations of the executed test scenario.

7. The test method according to claim 1, wherein the verification comprises verifying contents of areas of the shared memory space outside of any group, corresponds to the data items written in said initialization.

8. The test method according to claim 1, wherein the at least one transfer operation is defined in a random or quasi-random manner, by a random or quasi-random choice of at least one of the following parameters: a transfer operator, a mode of transfer, a group, a source block on the group, or a destination block on the group.

9. The test method according to claim 8, wherein the said random or quasi-random choice is constrained by a domain of use associated with each operator.

10. The test method according to claim 8, wherein the random or quasi-random choice is constrained by a rule for moving the blocks in a group, according to which rule the source block of each transfer becomes the destination block of the following transfer.

11. The test method according to claim 1, wherein the partitioning comprises defining groups with various sizes, and defining blocks with different alignments within the groups.

12. The test method according to claim 1 being arranged to have a first test loop for executing a plurality of test scenarios one after another, with at least one verification performed at the end of performance of each test scenario.

13. The test method according to claim 12, further being arranged to have a second test loop for modifying the partitioning between two scenarios.

14. The test method according to claim 13, further being arranged to have a third test loop for modifying transfer parameters of the data transfer operators and/or partitioning between two series of transfers.

15. The test method according to claim 1, further comprising updating an occupancy table for the blocks of the shared memory space indicating for each block whether or not the corresponding block is reserved by a transfer operation, and the table being consulted by the transfer operators before performing a transfer.

16. The test method according to claim 1, further comprising:
creating histograms of events corresponding to the transfer operations; and
verifying absence of bias in a statistical distribution of events accumulated in the histograms during the execution of the test method.

* * * * *